(12) United States Patent
Ishizu (10) Patent No.: US 7,075,964 B2
(45) Date of Patent: Jul. 11, 2006

(54) DIODE-PUMPED SOLID-STATE LASER OSCILLATOR

(75) Inventor: Mitsuo Ishizu, Koganei (JP)

(73) Assignee: National Institute of Information and Communications Technology, Tokyo (JP)

( * ) Notice: Subject to any disclaimer, the term of this patent is extended or adjusted under 35 U.S.C. 154(b) by 0 days.

(21) Appl. No.: 11/050,678

(22) Filed: Feb. 7, 2005

(65) Prior Publication Data

US 2005/0135452 A1    Jun. 23, 2005

Related U.S. Application Data

(63) Continuation of application No. 10/329,372, filed on Dec. 27, 2002, now Pat. No. 6,917,634.

(30) Foreign Application Priority Data

Dec. 28, 2001    (JP) ............................. 2001-400097

(51) Int. Cl.
    *H01S 3/14*    (2006.01)
    *H01S 3/09*    (2006.01)
(52) U.S. Cl. ........................................... 372/69; 372/39
(58) Field of Classification Search .................. 372/41, 372/39, 69, 70
    See application file for complete search history.

(56) References Cited

U.S. PATENT DOCUMENTS 5,416,789 A * 5/1995 Lejus et al. .................... 372/41
5,930,030 A    7/1999 Scifres
6,363,095 B1   3/2002 Jones et al. .................... 372/75
6,552,255 B1   4/2003 Tritt et al. .................... 136/203

FOREIGN PATENT DOCUMENTS

| EP | 0 352 059 A2 | 1/1990 |
| EP | 1160940 A1 | 5/2001 |
| JP | 01-230277 | 9/1989 |
| JP | 09-181376 | 7/1997 |
| JP | 2000-277839 | 10/2000 |
| JP | 2002-016306 | 1/2002 |

OTHER PUBLICATIONS

Robert S. Afzal, "Mars Observer Laser Altimeter: Laser Transmitter" Applied Optics, vol. 33. No. 15, May 20, 1994.
ATIS Committee T1A1, "Absorption Index", ATIS website, Feb. 28, 2001, 1 page.

* cited by examiner

*Primary Examiner*—Armando Rodriguez
(74) *Attorney, Agent, or Firm*—Oblon, Spivak, McClelland, Maier & Neustadt, P.C.

(57) ABSTRACT

A diode-pumped solid-state laser oscillator optically pumps a laser medium. The oscillator has at least one pumping light source that emits light in a predetermined wavelength band, and a laser medium that absorbs light in the wavelength band. In the wavelength band, the optical absorption index of the laser medium increases with an increase in wavelength, and the optical radiation energy of the light source decreases with an increase in wavelength. Thus, with respect to wavelength changes, an increase in the optical absorption index is cancelled out by a decrease in the radiation energy, making the stability of the laser output less dependent on the temperature of the optical pumping medium or laser medium.

2 Claims, 9 Drawing Sheets

Optical absorption index of 8-mm thick Nd:YAG

Optical Absorption index of three LDs with center wavelength separation of −5 nm and +5 nm

Fig. 9

DIODE-PUMPED SOLID-STATE LASER OSCILLATOR

CROSS-REFERENCE TO RELATED APPLICATIONS

This continuation application is based upon and claims the benefit of priority under 35 USC §120 from U.S. application Ser. No. 10/329,372, filed Dec. 27, 2002 now U.S. Pat. No. 6,917,634.

BACKGROUND OF THE INVENTION

1. Field of the Invention

The present invention relates to an optically pumped solid-state laser oscillator, and more particularly to a diode-pumped solid-state laser oscillator in which the output-power dependency on the temperature of the pumping laser diodes and the laser medium can be decreased.

2. Description of the Prior Art

In space satellites, aircraft, road vehicles and other such means of transportation, there are often limits on the amount of electrical power that can be used. Due to this limitation, laser oscillators required for stable output power for such mobile applications are usually excited by laser diodes (LDs) that have high efficiency.

However, as described in further detail below, the output power of such diode-pumped solid-state lasers varies due to the temperature dependency of the emission wavelength of the laser diodes. Changes in the temperature can change the pump-light absorption index of the laser rod used, altering the laser output power.

Figure 5:
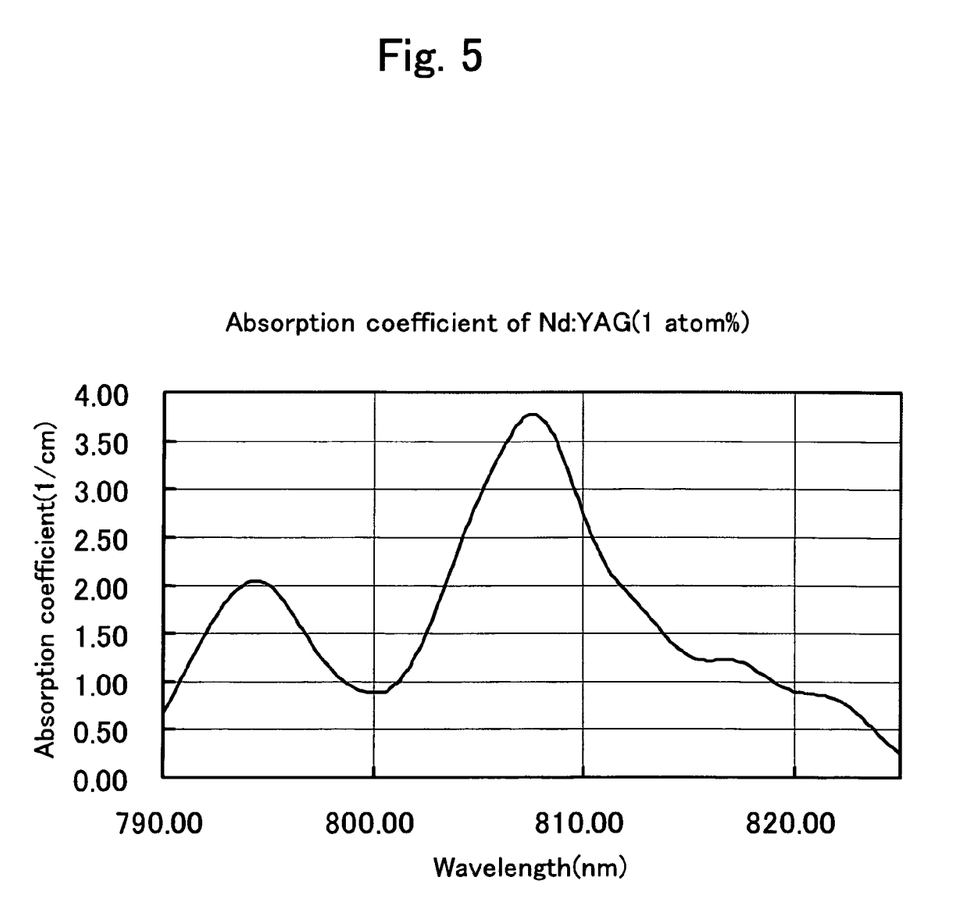
FIG. 5 is a graph showing the relationship between optical absorption coefficient and wavelength of a laser medium.
Figure 6:
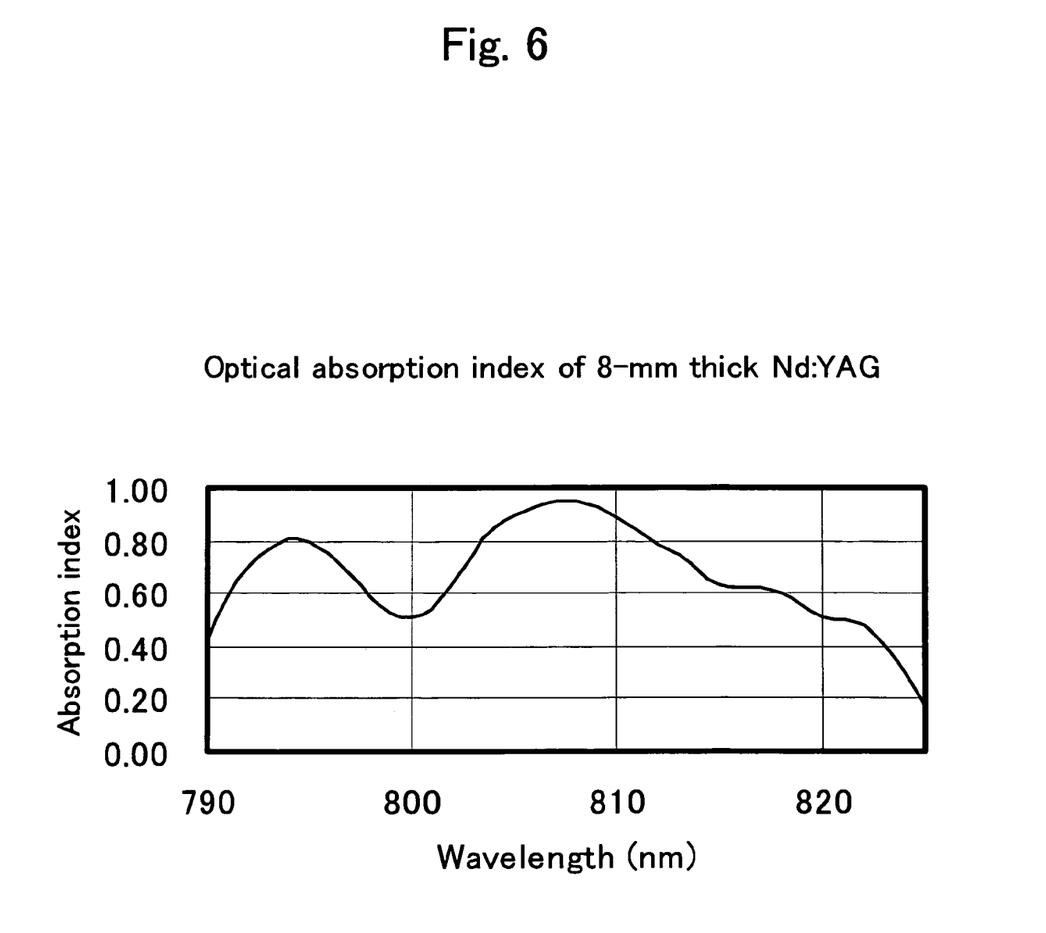
FIG. 6 is a graph showing the relationship between optical absorption index and wavelength of a laser medium.

The normal temperature dependence of the wavelength of a pumping LD is 0.27 nm per degree centigrade. This means that in the case of an LD that has an operating temperature range of 50° C., the emission wavelength can change by 14 nm. The absorption spectrum of a laser rod used in a diode-pumped solid-state laser consists of narrow spectral lines corresponding to the distribution of the excited energy levels of the Nd ion or other such laser active element used. FIG. 5 shows the absorption spectrum of a Nd:YAG laser crystal plotted with the resolution of 4 nm which is the same as the usual wavelength width of LD arrays. In the case of wavelengths of 802 to 817 nm that include an absorption peak at 808 nm, as in FIG. 5, the absorption coefficient changes from 3.8 $cm^{-1}$ to 1.2 $cm^{-1}$. If the propagation length of the pump light in the Nd:YAG crystal is 8 mm, the absorption index will vary from 95% to 62% within these wavelengths, as shown in FIG. 6.

In the prior art, lasers are designed to obtain optimal laser oscillation, for example, taking the pumping center wavelength to 808 nm at the absorption peak of the laser crystal. Therefore, wavelength deviation of LDs arising from the changes in temperature results in a decrease in pump-light absorption, reducing the output power. In order to prevent such reduction, it has been necessary to maintain the LDs at a constant temperature, for which controlling mechanism needs to be installed. However, it consumes a relatively large amount of electrical power compared to the pumping power in controlling the temperature of a pump-light source or laser medium, so when electrical power is limited, it is difficult to accomplish such a control.

Figure 9:
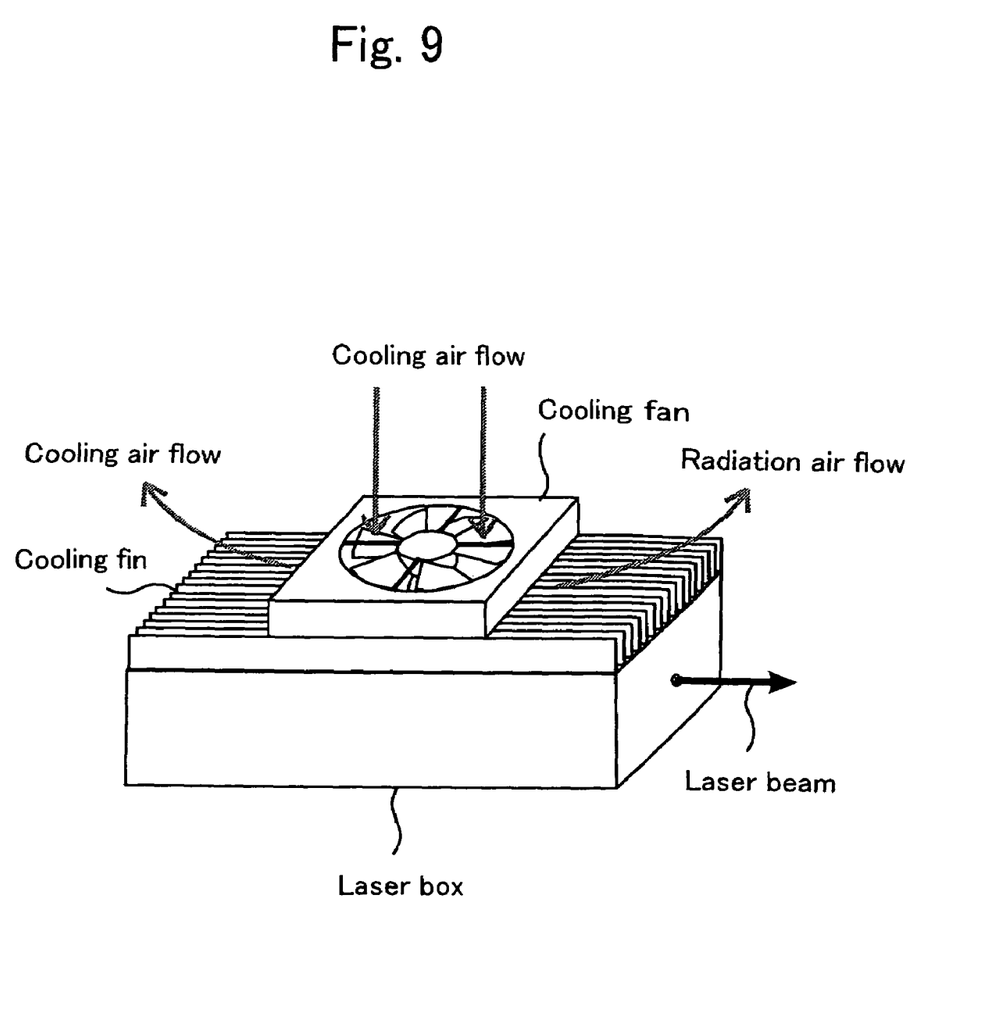
FIG. 9 is a diagram of an air-cooled diode-pumped laser.

In the case of the air-cooled diode-pumped laser shown in FIG. 9, for example, the cooling airflow at the radiation fins is controlled to stabilize the temperature of the LDs. This means that electrical power is necessary to cool and to stabilize the temperature of the cooling fins. Moreover, vibrations and noises generated by a cooling fan perturb the laser resonator, reducing the stability of the output power. In addition, the temperature control has a high time constant that makes it difficult for the system to respond quickly to the temperature changes.

In the case of a water-cooled diode-pumped laser known to the inventor, cooling water controlled to a designed temperature is circulated to maintain the temperature of the LDs. This cooling apparatus is bulky and consumes a lot of electrical power. Here too, vibrations from the pumps used in the cooler and circulator are large and result in a loss of output power stability.

In the an additional known small power diode-pumped laser, the LDs are cooled using a Peltier cooling element. Since the cooling efficiency of the Peltier element is not high, in an environment where there is limited electrical power, such an element can be used only in small power lasers.

The diode-pumped Nd:YAG laser oscillator for use in the laser altimeter installed in NASA's Mars Observer spacecraft has a partial resemblance to the present invention. This laser oscillator is described in a paper (Robert Afzal, "Mars Observer Laser Altimeter," Applied Optics vol. 33, No. 15, pp 3184–3188 (1994)) that also includes a graph showing the relationship between the laser oscillator output power and the operating temperature. In the laser oscillator, the pumping source is four diode-laser stacks of 11 diode bars having a narrow wavelength width of 6 nm. The result is a range of operating temperatures that is wider than that obtained using pumping at just one wavelength. However, this laser oscillator differs from that of the present invention in that it does not use the optical absorption characteristics of the laser medium and the temperature characteristics of the pumping source.

As described in the foregoing, although in the prior art diode-pumped solid-state laser oscillators are used where there is limited electrical power, they have a number of problems, such as that electrical power is required for cooling, that air cooling has a high time constant and vibration produced by the cooling system also makes it difficult to maintain a stable output, that water cooling requires a large apparatus and the vibration has an adverse effect on output stability, and that cooling systems that use a Peltier element do not generate vibration but do require a lot of electrical power.

In view of the above, an object of the present invention is to provide a diode-pumped solid-state laser oscillator that is able to provide a stable laser output power using less electrical power for temperature control.

SUMMARY OF THE INVENTION

To attain the above object, in accordance with a first aspect the present invention provides a diode-pumped solid-state laser oscillator comprising at least one pumping light source that emits light in a predetermined wavelength band, and a laser medium that absorbs light in the band; the laser medium having characteristics whereby, in the band, an optical absorption index of the laser medium increases with an increase in wavelength, and the pumping diodes having characteristics whereby, in the band, optical radiation energy of the pumping diodes decreases with an increase in wavelength. Thus, with respect to wavelength changes, an increase in the optical absorption index is cancelled out by a decrease in the radiation energy.

In accordance with a second aspect, the above object is also attained by a diode-pumped solid-state laser oscillator in which a laser medium is pumped in a plurality of wavelength bands, comprising a first pumping laser diodes that emits light in a predetermined first wavelength band, a second pumping laser diodes that emits light in a predetermined second wavelength band, and a laser medium that absorbs light in the two bands, the laser medium having characteristics whereby, in the first wavelength band, an optical absorption index of the laser medium decreases with an increase in wavelength, and in the second wavelength band, the optical absorption index of the laser medium increases with an increase in wavelength. This cancels out the wavelength dependency of the pumping energy received by the laser medium.

In accordance with a third aspect, the above object is also attained by a diode-pumped solid-state laser oscillator in which a laser medium is pumped in an extended plurality of wavelength bands, comprising a plurality of pumping laser diodes that each emit light in a plurality of predetermined wavelength bands having different center wavelengths, and a laser medium that absorbs light of each wavelength band, wherein a temperature dependency of a wavelength integration of a product of spectrum intensity of the pumping laser diodes and an optical absorption index of the laser medium is lower than a temperature dependency of a wavelength integration of a product of spectrum intensity of a single pumping laser diode and the optical absorption index of the laser medium.

In accordance with a fourth aspect, in a wavelength segment in which the absorbed optical energy of the laser medium increases or decreases, the pumping light source is switched in accordance with changes in the temperature of the operating environment. This makes it possible to expand the range of temperatures in which the laser oscillator can be used.

In accordance with a fifth aspect, with respect to heat extraction from the pumping light source, temperature of the pumping light source can be adjusted in response to changes in temperature of the operating environment by modifying the thermal resistance between the pumping light source and the environment, making it possible to expand the range of temperatures in which the laser oscillator can be used.

Further features of the invention, its nature and various advantages will be more apparent from the accompanying drawings and following detailed description of the invention.

DESCRIPTION OF THE PREFERRED EMBODIMENT

The present invention relates to a laser oscillator that enables constant absorbed optical energy by the laser rod, even if the LD temperature changes. Details of the invention are explained below with reference to the drawings. In the drawings, parts having the same or similar functions have been given the same reference numerals.

Generally, for a unit wavelength segment, the optical energy that a laser medium absorbs is the product of the spectrum intensity of the pumping source and the absorption index of the laser medium. However, because these are wavelength-dependent, in respect of wavelength, it is an integrated value of the product that constitutes the optical energy absorbed by the laser medium.

EXAMPLE 1

Generally, the output power of an LD decreases as the temperature increases. Also, the pump-light absorption index of the solid-state laser medium has the wavelength dependency shown in FIG. 6. That is, in a prescribed wavelength band, the optical absorption index increases with an increase in wavelength.

FIG. 6 is a graph showing the wavelength dependency of the optical absorption index of a laser medium. As described below, a change in the absorbed pumping energy arising from a temperature change is minimized when combining a plurality of LDs having two or more different emission wavelengths. The temperature dependency of the optical output power of an LD is usually in the order of −0.24%/deg. Therefore, with respect to changes in LD temperature, a constant absorbed energy can be obtained by imparting to the absorption index of the laser medium, a temperature dependency of +0.24%/deg. When a Nd:YAG rod is used, the temperature dependency of the absorption index is negligible, so the above described change in the absorption index can be achieved by changing the wavelength. This is part of the gist of this invention. This Example corresponds mainly to the first aspect of the invention. In accordance with the gist, when temperature dependency is converted into wavelength, the temperature dependency of the absorption index (0.24%/deg)/(0.27 nm/deg) comes out to 0.9%/nm, in which case it can be seen that it is possible to maintain a constant absorbed energy in the face of changes in LD temperature.

Figure 1:
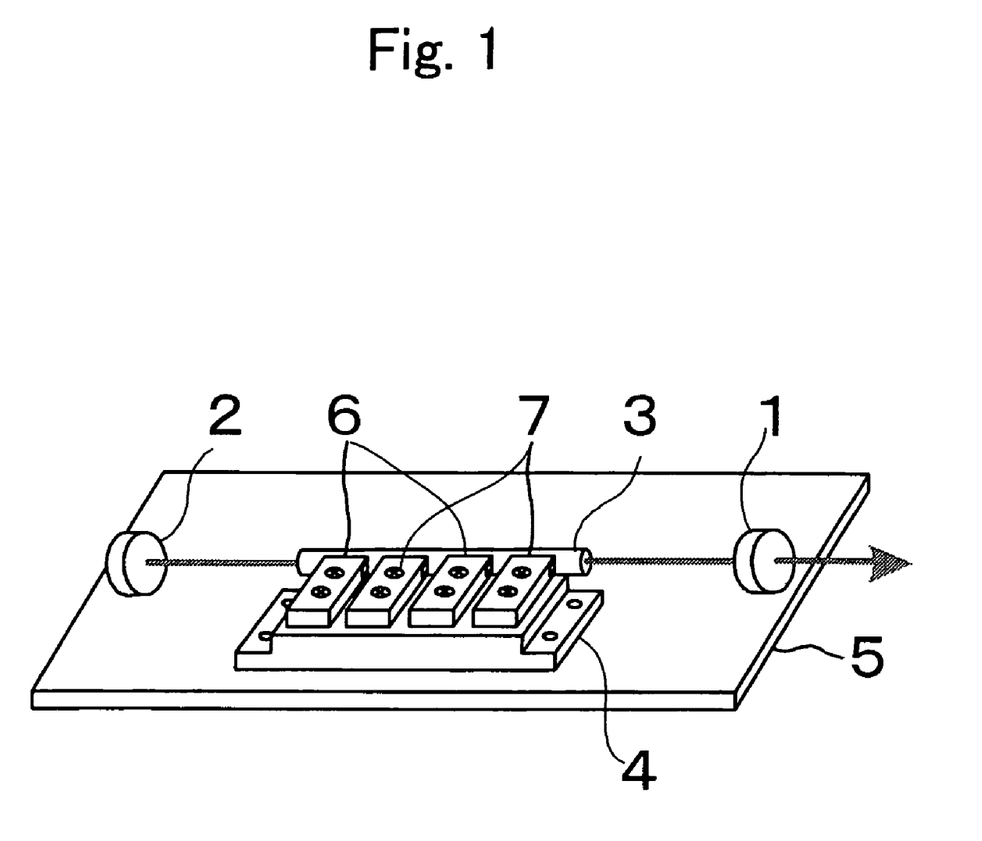
FIG. 1 is a diagram of the laser oscillator according to a first embodiment of the present invention.
Figure 7:
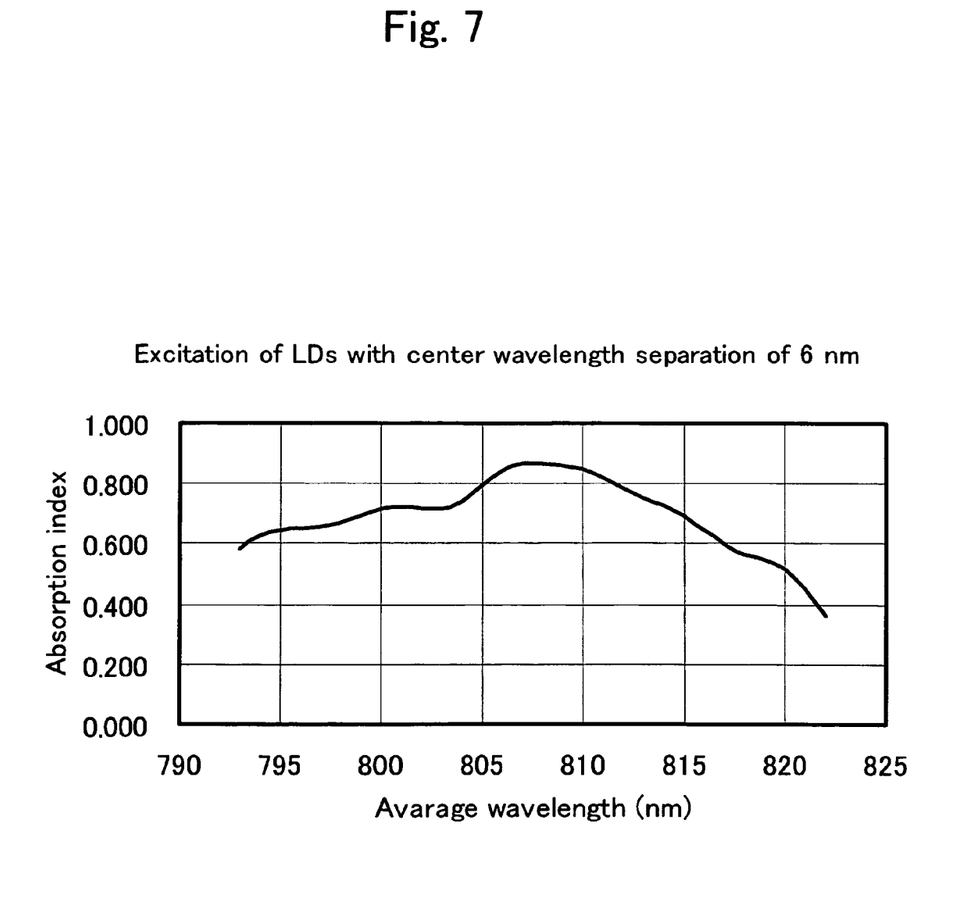
FIG. 7 is a graph showing the relationship between optical absorption index and wavelength of a laser medium, using LDs with two different emission wavelengths.

FIG. 1 shows an example of a configuration for doing this. In the pumping laser oscillator shown in FIG. 1, a solid-state laser rod 3 located in an optical resonator formed by an output mirror 1 and an end mirror 2 is optically excited by pumping LD 6 and pumping LD 7. Reference numeral 4 denotes an LD mount and numeral 5 a heat-dissipation laser baseplate. When the propagation length of the pumping light in the laser rod 3 (Nd:YAG rod) is 8 mm, in the case of the simplest configuration in which pumping is effected using a combination of LDs operating at two wavelengths, an optimum wavelength combination that provides a smooth change in absorbed pumping energy over a wide range of wavelengths would be one in which the same numbers of LDs have center wavelength separations of 6 nm (for example, two 805-nm LDs and two 811-nm LDs at 25° C.). FIG. 7 shows the absorption index in the case of such a configuration. FIG. 7 shows that with the extinction of the 800-nm absorption trough, an average wavelength dependency of 1.5%/nm was obtained over the range 793 nm to 810 nm. Thus, with this LD pumping, at an operating temperature of 57° C., there is a smooth increase in laser output, with no major fluctuations. It is therefore possible to omit temperature stabilization mechanism used in the prior art. This mainly corresponds to the second aspect of the invention.

Figure 8:
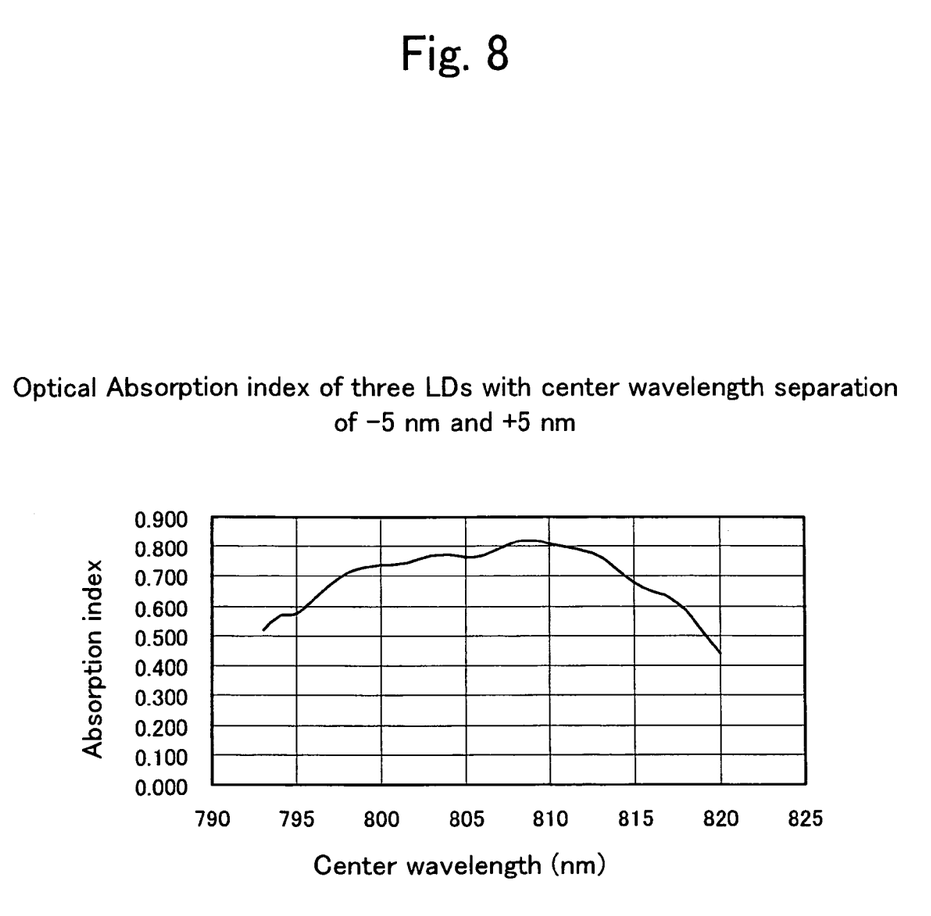
FIG. 8 is a graph showing the relationship between optical absorption index and wavelength of a laser medium, using LDs with three different emission wavelengths.

Increased effectiveness can be obtained using a combination of a plurality of LDs operating at three different wavelengths. This corresponds to the third aspect of the invention. In this case, a smooth change in absorption index is obtained over a wider range of wavelengths than the above two-wavelength configuration, by using the same numbers of pumping LDs having center wavelength separations of −5 nm and +5 nm (for example, two 800-nm LDs, two 805-nm LDs and two 810-nm LDs, at 25° C.). FIG. 8 shows the absorption index. An absorption index of more or less 0.9%/nm was obtained over the range 798 nm to 810 nm, for a constant pump-light absorbed energy, while the laser output was also constant. The operating temperature range in this case was 40 degrees, so it is possible to readily obtain an operating temperature zone in an indoor operating environment. It can be readily understood that an even more gradual change in absorption index can be obtained over a wider range of wavelengths by using larger numbers of LDs with different operating wavelengths.

Lasers mounted on space satellites can undergo unforeseeable changes in the space environment, such as changes in solar orientation, and major changes in the temperature of their environments arising from changes that take place over time in satellite heat-control mechanisms and the like. For these reasons, the permissible operating temperature range of device circuitry is usually set over a wide range of −20 to 55° C. This is about twice the operating temperature range achieved using the configuration of the first embodiment. The operating temperature range of the laser oscillator can be increased when using the technology described below.

EXAMPLE 2

Figure 2:
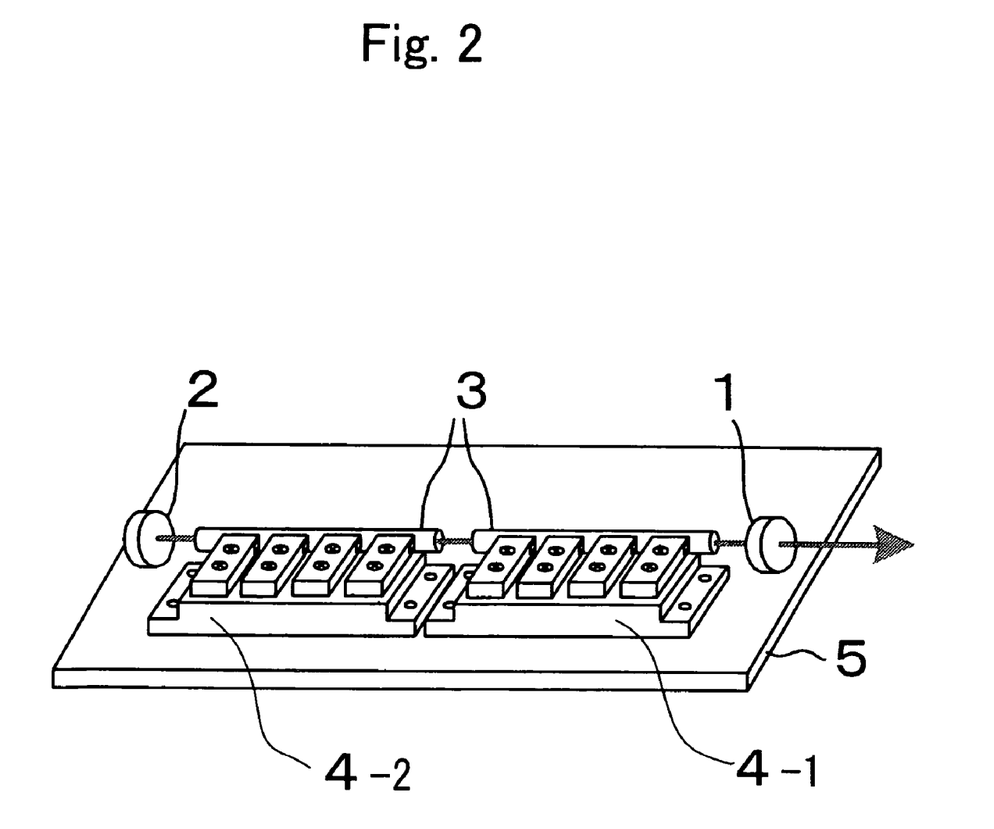
FIG. 2 is a diagram of the laser oscillator according to a second embodiment.

This corresponds to the fourth aspect of the invention. In this Example, another array of LDs is incorporated in addition to the LDs of Example 1, with the additional LDs operating at a wavelength differentiated by the amount required for the expanded range of operating temperatures. The system switches between the two arrays of LDs in accordance with the operating temperature. For this, the laser oscillator is configured as shown in FIG. 2. In the pumping laser oscillator shown in FIG. 2, a solid-state laser rod 3 is located in an optical resonator formed by an output mirror 1 and an end mirror 2. The LDs on LD mount 4-1 are used for high-temperature pumping, and the LDs on LD mount 4-2 are used for low-temperature pumping. Heat generated by the LDs is transmitted via the LD mount to the laser base-plate 5, where it is cooled by air, water, or heat sink. Different LDs are used for high-temperature and low-temperature pumping. Which array of LDs is used depends on the ambient temperature. The same LDs can be used for the low-temperature array and the high-temperature array, by using material having low thermal conductivity for the low-temperature LD mount. In accordance with this configuration, the pumping source wavelength range is not changed, but the solid-state-laser operating temperature range can be increased by switching between the two LD arrays.

EXAMPLE 3

This also relates to the fourth aspect of the invention. The configuration of FIG. 2 is used, the difference from Example 2 being that both of the LD mounts have the same thermal conductivity. At the same temperature, each LD array is set to emit light at a different wavelength. The emission wavelength of the high-temperature LDs at a high temperature is the same as the emission wavelength of the low-temperature LDs at a low temperature. The solid-state-laser operating temperature range can be increased when switching the LD arrays according to the temperature of the operating environment.

EXAMPLE 4

Figure 3:
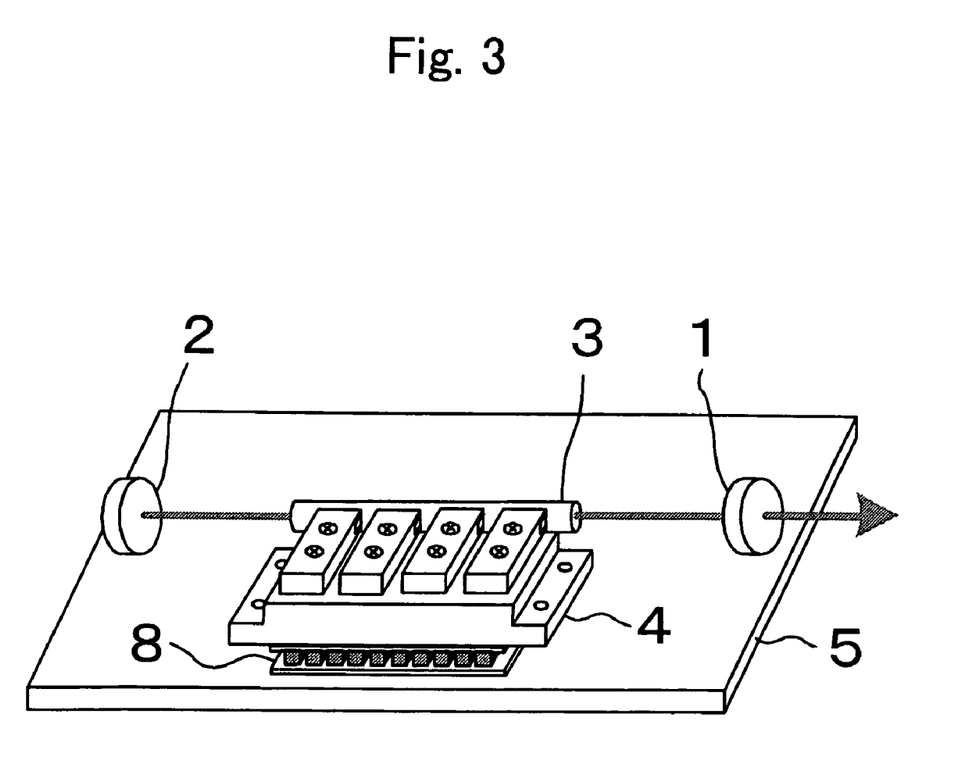
FIG. 3 is a diagram of the laser oscillator according to a third embodiment.
Figure 4:
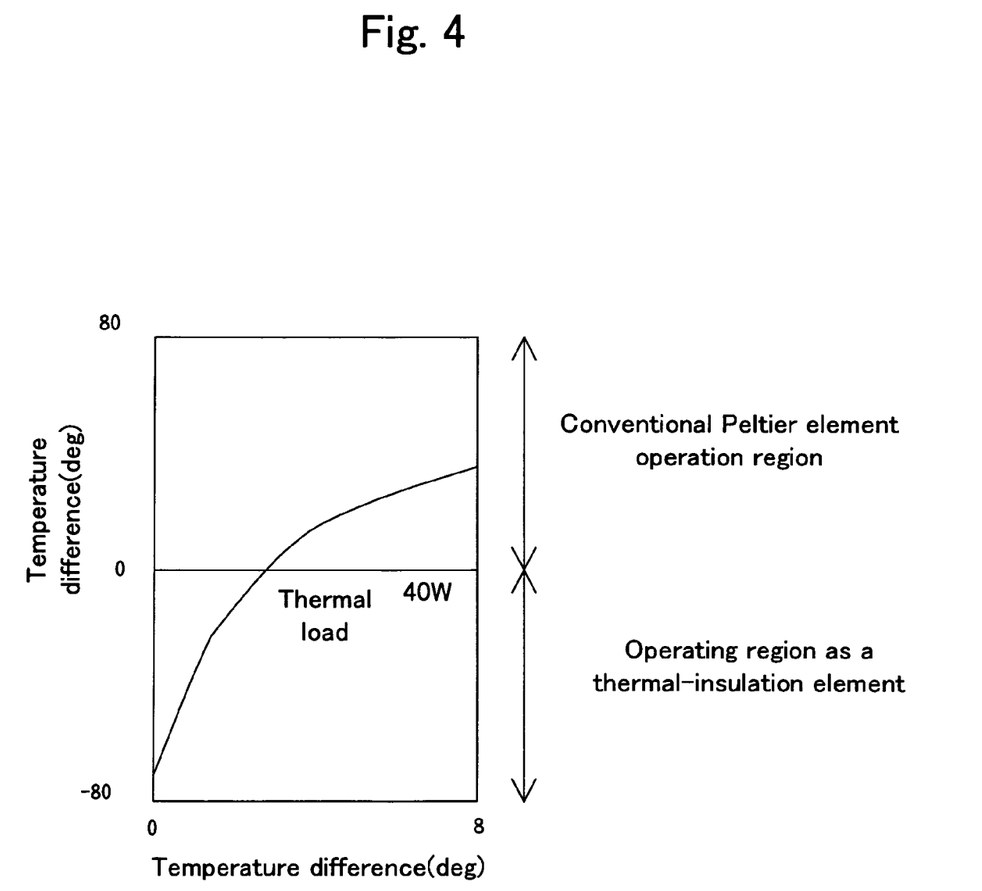
FIG. 4 is a graph showing the current-temperature difference characteristics of a Peltier cooling element.

This corresponds to the fifth aspect of the invention. As shown in FIG. 3, a Peltier thermal-insulation element 8 is disposed between the LD mount 4 and the heat-dissipation laser base-plate 5 of Example 1. The thermal conductivity of the Peltier thermal-insulation element 8 is set to be high (low) in a high-temperature (low-temperature) environment. In a low-temperature environment, this prevents the LD operating temperature from decreasing, thereby increasing the operating temperature range in which a constant laser output can be obtained. A conventional Peltier element used for cooling electronic devices can be used for the Peltier thermal-insulation element 8, making it possible to effect control using less electrical power compared to where cooling and heating is used to keep the temperature constant. In a high-temperature environment, a current is passed through the Peltier element to set the thermal conductivity high. As the temperature decreases, the current is reduced, which reduces the thermal conductivity, preventing the LD temperature from decreasing. By using a Peltier element (DuraTec DT12-8) through which an electric current is passed, the temperatures on each side of the element can be changed as shown in FIG. 4. This characteristic can be regarded as using an electrical current to change the thermal resistance.

The present invention configured as described in the foregoing provides the following effects.

In accordance with Example 1, the wavelength dependency of the optical absorption index of the laser medium is used to maintain the total amount of pumping light absorbed by the laser medium at a constant level, thereby achieving a constant laser output, even when changes in the laser operating temperature change the emission energy of the LDs and cause a shift in emission wavelength. The LDs do not have to be maintained at a constant temperature to achieve a constant laser output, and there is also no need for temperature stabilization mechanisms and circuits, making it possible to simplify the structure of the laser oscillator and power supply sections.

In accordance with Examples 2 and 3, even if changes in the laser operating temperature produce changes in LD emission wavelength, reducing (increasing) the absorption of LD light of a first wavelength, the absorption of LD light of a second wavelength can be increased (decreased), maintaining the total amount of pumping light absorbed by the laser medium at a constant level, and thereby achieving a constant laser output.

In addition to the light sources of each of Examples 1 to 3, Example 4 uses an additional plurality of light sources able to cover a plurality of wavelength bands, thereby enabling stable laser output over a wider range of temperatures. Example 4 also achieves this with a configuration for changing the pumping source temperature in response to changes in the temperature of the operating environment, which is done by changing the thermal resistance.

What is claimed is:

1. A diode-pumped solid-state laser oscillator comprising:
a laser medium which is pumped by diode-laser pumping sources;
the diode-laser pumping sources emitting light at a pair of first and second wavelengths where the first wavelength is set in a wavelength span at a position on a one-side slope of a pair of slopes of an absorption spectrum of the laser mediums, where an optical absorption index of the laser medium increases with an increase in wavelength, and the second wavelength is set in a wavelength span at a position on an opposite side-slope of another pair of slopes of the absorption spectrum, where the optical absorption index decreases with an increase in wavelength; and
an optical resonator having an optical axis on which the laser medium is disposed.

2. A diode-pumped solid-state laser oscillator comprising:
a laser medium that absorbs light from diode-laser pumping sources;
three or more sets of the diode-laser pumping sources being configured to emit light at a set of wavelengths, each of which is in a wavelength span at a position on a different slope of an absorption spectrum of the laser medium, wherein optical absorption indexes of the laser medium for each of the set of wavelengths increases or decreases according to an increase in wavelength, and absorbed pumping power, which is a sum of products of each optical power of the diode-laser pumping sources and each absorption index at the set of wavelengths, has a lower temperature dependency against environmental variation of the diode-laser pumping sources than that of an absorbed pumping power from a diode-laser pumping source emitting in one wavelength; and
an optical resonator having an optical axis on which the laser medium is disposed.

* * * * *